(12) United States Patent
Matsumoto et al.

(10) Patent No.: US 8,461,069 B2
(45) Date of Patent: Jun. 11, 2013

(54) LIGHT EMITTING DIODE ELEMENT

(75) Inventors: Syuji Matsumoto, Yokohama (JP);
Tomoyuki Kobayashi, Yokohama (JP);
Naoki Sugimoto, Yokohama (JP);
Satoshi Fujimine, Yokohama (JP);
Nobuhiro Nakamura, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/270,761

(22) Filed: Oct. 11, 2011

(65) Prior Publication Data

US 2012/0074447 A1   Mar. 29, 2012

Related U.S. Application Data

(62) Division of application No. 11/325,529, filed on Jan. 5, 2006, now abandoned.

(30) Foreign Application Priority Data

Apr. 15, 2005  (JP) .................................. 2005-118413
Sep. 2, 2005   (JP) .................................. 2005-254906

(51) Int. Cl.
*C03C 3/62*  (2006.01)
*H01L 33/00* (2010.01)
*C03C 3/19*  (2006.01)

(52) U.S. Cl.
CPC .. *H01L 33/00* (2013.01); *C03C 3/19* (2013.01)
USPC .............................. 501/45; 257/100; 313/512

(58) Field of Classification Search
CPC .................................... C03C 3/16; H01L 33/00
USPC ....................... 501/73, 45; 257/100; 313/512
See application file for complete search history.

(56) References Cited

U.S. PATENT DOCUMENTS

| | | | | |
|---|---|---|---|---|
| 5,246,890 | A | * | 9/1993 | Aitken et al. .................... 501/15 |
| 6,048,811 | A | * | 4/2000 | Morena .......................... 501/15 |
| 7,033,966 | B2 | | 4/2006 | Kobayashi et al. |
| 7,872,281 | B2 | | 1/2011 | Nakamura et al. |
| 7,872,417 | B2 | | 1/2011 | Nakamura et al. |
| 2002/0020843 | A1 | | 2/2002 | Uemura |
| 2002/0070449 | A1 | | 6/2002 | Yagi et al. |
| 2004/0169466 | A1* | | 9/2004 | Suehiro et al. ................. 313/512 |
| 2004/0207314 | A1* | | 10/2004 | Aitken et al. .................. 313/504 |
| 2004/0207998 | A1 | | 10/2004 | Suehiro et al. |
| 2005/0161771 | A1 | | 7/2005 | Suehiro et al. |
| 2005/0211997 | A1 | | 9/2005 | Suehiro et al. |
| 2006/0049421 | A1 | | 3/2006 | Suehiro et al. |
| 2009/0059591 | A1 | | 3/2009 | Nakamura et al. |
| 2009/0072265 | A1 | | 3/2009 | Nakamura et al. |

FOREIGN PATENT DOCUMENTS

| | | |
|---|---|---|
| JP | 9-175833 | 7/1997 |
| JP | 11-177129 | 7/1999 |
| JP | 11-322360 | 11/1999 |
| JP | 2000-44253 | 2/2000 |
| JP | 2000-327369 | 11/2000 |
| JP | 2002-203989 | 7/2002 |
| JP | 2003-34549 | 2/2003 |

* cited by examiner

*Primary Examiner* — Nicholas P D'Aniello
(74) *Attorney, Agent, or Firm* — Oblon, Spivak, McClelland, Maier & Neustadt, L.L.P.

(57) ABSTRACT

A light emitting diode element having a light emitting diode; and a glass covering sealing the light emitting diode is provided. The glass of the covering consists essentially of from 30 to 70 mol% of SnO, from 15 to 50 mol% of $P_2O_5$, from 0.1 to 20 mol% of ZnO, from 0 to 10 mol% of $SiO_2+GeO_2$, from 0 to 30% of $Li_2O+Na_2O+K_2O$, and from 0 to 20% of MgO+CaO+SrO+BaO. In an embodiment, a refractive index of the glass of the covering is at least 1.6 at a wavelength of 400nm.

14 Claims, 2 Drawing Sheets

LIGHT EMITTING DIODE ELEMENT

CROSS REFERENCE TO RELATED APPLICATIONS

This application is a divisional application of prior U.S. Patent application No. 11/325,529, filed Jan. 5, 2006, the disclosure of which is incorporated herein by reference in its entirety. The parent application claims priority to Japanese Application No. 2005-118413, filed Apr. 15, 2005, and Japanese Application No. 2005-254906, filed Sep. 2, 2005, the disclosures of which are incorporated herein by reference in their entireties.

BACKGROUND OF THE INVENTION

1. Field of the Invention

The present invention relates to a light emitting diode element (hereinafter referred to as a LED element) having a light emitting diode (hereinafter referred to as LED) sealed by glass.

2. Discussion of Background

Heretofore, as a white light source, an incandescent bulb, a fluorescent lamp or the like has been widely used. In recent years, as a new type of white light source, a so-called white LED element has been developed, and its application to e.g. a backlight for liquid crystal display has been rapidly progressing.

In a presently commercially available typical one chip type white LED element, LED of a quantum well structure having a luminous layer of InGaN having In added to GaN, is sealed by a resin having a YAG phosphor.

This white LED element functions as a white light source as follows. Namely, when a direct current is conducted to LED, a blue light will be emitted from LED. On the other hand, the YAG phosphor will be excited by a part of the blue light, and a yellow light (fluorescence) will be emitted from this phosphor. Such blue light and yellow light are in a relation of complementary colors, and when they enter into human eyes in a mixed state, they will be observed as white light by the principle of an additive color mixture.

However, such a white LED element having LED sealed by a resin has had a problem such that when it is used for a long period of time, moisture tends to penetrate into the resin, whereby the operation of LED will be hindered, and by ultraviolet rays discharged from LED, the resin undergoes a color change, whereby its light transmittance tends to decrease.

As a white LED element to solve such a problem, JP-A-2002-203989 proposes at pages 2 to 7 one having LED formed on a substrate in a flip chip form, and such LED is sealed by sol-gel glass.

However, in such sol-gel glass, pores are present or tend to remain, whereby the hindrance by moisture of the LED operation may not sufficiently be suppressed. To solve such a problem of pores, heat treatment at 1,300° C. may typically be carried out, but there has been a problem that heat treatment at a very high temperature like 1,300° C. can not be applied to the production of a LED element.

SUMMARY OF THE INVENTION

It is an object of the present invention to provide a LED element which does not bring about such problems.

The present invention provides a LED element having LED sealed by glass, wherein the glass consists essentially of, as represented by mol % based on the following oxides, from 30 to 70% of SnO, from 15 to 50% of $P_2O_5$, from 0.1 to 20% of ZnO, from 0 to 10% of $SiO_2+GeO_2$, from 0 to 30% of $Li_2O+Na_2O+K_2O$, and from 0 to 20% of MgO+CaO+SrO+BaO (first aspect).

Further, the present invention provides a LED element having LED sealed by glass, wherein the glass consists essentially of, as represented by mol % based on the following oxides, from 20 to 55% of $B_2O_3$, from 1 to 20% of $Bi_2O_3$, from 0 to 30% of ZnO, from 0 to 20% of $SiO_2+GeO_2$, from 0 to 30% of $Li_2O+Na_2O+K_2O$, and from 0 to 30% of MgO+CaO+SrO+BaO (second aspect).

Further, the present invention provides a LED element having LED sealed by glass, wherein the glass consists essentially of, as represented by mol % based on the following oxides, from 20 to 70% of $TeO_2$, from 3 to 30% of ZnO, from 0 to 55% of $B_2O_3$, from 0 to 10% of $SiO_2+GeO_2$, from 0 to 30% of $Li_2O+Na_2O+K_2O$, and from 0 to 20% of MgO+CaO+SrO+BaO (third aspect).

Further, as an embodiment suitable in a case where it is desired to prevent a problem occurring during the sealing or thereafter due to mismatching with the expansion coefficient of e.g. sapphire which is commonly used as a LED substrate (the average linear expansion coefficient within a range of from 50 to 300° C. (hereinafter this linear expansion coefficient will be referred to as α) is typically $80 \times 10^{-7}$/° C.), the present invention provides a LED element having a substrate having α of from $70 \times 10^{-7}$ to $90 \times 10^{-7}$/° C., wherein the substrate is covered with glass which has a softening point of at most 500° C., α of from $65 \times 10^{-7}$ to $95 \times 10^{-7}$/° C., an internal transmittance with a thickness of 1 mm for a light having a wavelength of 405 nm (hereinafter, this internal transmittance will be referred to as $T_{405}$) being at least 80% and a refractive index for the same light being at least 2.0 (fourth aspect).

Further, as another preferred embodiment in a similar case, the present invention provides a LED element having a substrate having α of from $70 \times 10^{-7}$ to $90 \times 10^{-7}$/° C., wherein the substrate is covered with glass which has a softening point of at most 500° C., α of from $65 \times 10^{-7}$ to $95 \times 10^{-7}$/° C., $T_{405}$ of at least 80% and a refractive index of at least 1.7 for the same light and which contains no PbO (fifth aspect).

Further, as glass for covering a LED element suitable in a case where it is desired to prevent a problem occurring during the sealing or thereafter due to mismatching of the expansion coefficient with the expansion coefficient of e.g. sapphire which is commonly used as a substrate for LED, the present invention provides glass for covering a LED element (hereinafter this glass will be referred to as the glass of the present invention), which has $T_{405}$ of at least 80% and which consists essentially of, as represented by mol % based on the following oxides, from 40 to 53% of $TeO_2$, from 0 to 10% of $GeO_2$, from 5 to 30% of $B_2O_3$, from 0 to 10% of $Ga_2O_3$, from 0 to 10% of $Bi_2O_3$, from 3 to 20% of ZnO, from 0 to 3% of $Y_2O_3$, from 0 to 3% of $La_2O_3$, from 0 to 7% of $Gd_2O_3$ and from 0 to 5% of $Ta_2O_5$, and $TeO_2+B_2O_3$ is at most 75 mol %.

According to the present invention, LED can be sealed or covered by glass without employing a sol-gel method, whereby hindrance of the operation of LED due to moisture scarcely takes place.

Further, it becomes possible to cover LED by glass having a refractive index being large and a small difference in the expansion coefficient from the sapphire substrate, without impairing the light-emitting function of LED.

With a LED element covered by such glass or with the LED element of the present invention, the light-withdrawing efficiency from such a glass-covered portion will be high.

DETAILED DESCRIPTION OF THE PREFERRED EMBODIMENTS

In the LED element of the present invention, in each case, LED is sealed or covered by glass, and in each case, such glass is one which can not be prepared by a sol-gel method, i.e. such glass is not sol-gel glass in each case.

In the LED element of the present invention, LED is sealed, for example, by placing a glass block having a proper shape on LED and letting this glass block soften and flow; LED is sealed by means of glass in a molten state; or LED is sealed by densely covering LED with glass in a powder state and then letting glass in a powder state soften and flow. Usually, a phosphor is added to the above glass block, the above glass in a molten state or the above glass in a powder state. Hereinafter, the glass which seals LED (including one having a phosphor dispersed therein) may sometimes be referred to as the sealing glass.

Now, the present invention (mainly the first, second and third aspects of the present invention) will be described with reference to FIG. 1, but the present invention is by no means thereby restricted.

Figure 1:
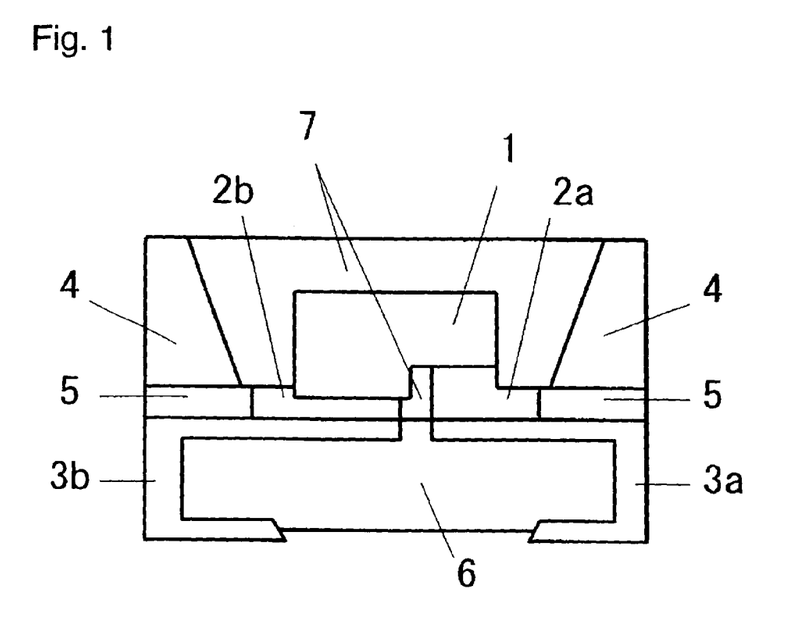
FIG. 1 is a view showing one embodiment of the LED element of the present invention in cross section.

FIG. 1 shows an embodiment of the LED element of the present invention in cross section. Reference numeral 1 indicates LED, 2a and 2b electrodes, 3a and 3b lead frames, 4 a housing, 5 an insulating layer, 6 a mount section, and 7 the sealing glass.

LED1 is typically LED which emits ultraviolet light or blue light having a wavelength of from 360 to 480 nm, and it may, for example, be LED (InGaN LED) of a quantum well structure having a luminous layer made of InGaN having In added to GaN. In a case where LED1 is InGaN LED, the portions in contact with electrodes 2a and 2b are a n-type semiconductor and a p-type semiconductor, respectively. Further, on LED1, a substrate made of e.g. sapphire is present, but such a substrate is not shown.

The electrodes 2a and 2b are to conduct a direct current to LED1, and they are usually made of gold, platinum or the like and will be formed by a plating method, a vapor deposition method or the like on the surface of lead frames 3a and 3b of a thin plate shape.

The lead frames 3a and 3b are electrically connected to the electrodes 2a and 2b, respectively, by bonding or close contact and will function as terminals for external connection. The lead frames 3a and 3b are preferably thin plates of a conductive material, whereby bonding or close contact with the electrodes 2a and 2b can easily be made, and they are excellent in the heat dissipation property. The conductive material is typically a metal, which may, for example, be aluminum or an aluminum alloy.

The housing 4 is usually one having an aperture formed at the center of a metal plate. The inner surface of this aperture is preferably made to have a tapered shape as shown in FIG. 1 so that light emitted in a horizontal direction from LED1 is reflected and efficiently taken out from the top of the LED element. Further, the shape of such an aperture is typically circular, but is not limited thereto, and it may be oval, square or the like.

The metal plate is required to be one capable of maintaining the shape stably even when the temperature is raised at the time of sealing LED1 by the glass. Such a temperature is, for example, at most 450° C., and as a metal plate suitable in such a case, an aluminum plate or an aluminum alloy plate may, for example, be mentioned.

In a case where an aluminum plate or an aluminum alloy plate is employed as the metal plate, the reflectance to ultraviolet light and visible light is at least 90%, whereby the light-withdrawing efficiency from the LED element can be made high.

Of the surface of the housing 4, the surface constituting the outer surface of the LED element is preferably excellent in the electrical insulating properties. Otherwise, through the surface, the electrode 2a and the electrode 2b may likely be short-circuited or electrically connected. In order to increase the electrical insulating properties of the above surface, such surface may be subjected to oxidation treatment to convert it to alumite, in the case where the housing 4 is aluminum or an aluminum alloy.

The insulating layer 5 is to electrically insulate the housing 4 from the electrodes 2a and 2b, and one made of a resin, ceramic, glass or the like may, for example, be mentioned. However, it is required to be one capable of maintaining the shape stably even when the temperature is raised at the time of sealing.

As the mount section 6, one made of a resin, ceramics, glass or the like which is excellent in the electrical insulating properties, may, for example, be mentioned. In a case where the mount section 6 is already formed at the time of sealing, it is required to be one capable of maintaining the shape stably even when the temperature is raised at the time of sealing, and one made of alumina is, for example, preferred.

The sealing glass 7 is to seal LED1 not to let the surface of LED1 be exposed to the atmosphere.

The softening point ($T_S$) of the glass to be used for the sealing glass 7 is preferably at most 500° C. If it exceeds 500° C., the temperature to let this glass soften and flow to seal LED1, tends to be too high, and there may be a problem such that the light-emitting properties of LED1 will deteriorate, the emission wavelength will change, or no emission will take place. It is more preferably at most 450° C., further preferably at most 400° C., particularly preferably at most 350° C., most preferably at most 330° C.

The refractive index at a wavelength of 400 nm (hereinafter, this refractive index will be referred to as n) of the glass to be used for the sealing glass 7 is preferably at least 1.6. If it is less than 1.6, the light-withdrawing efficiency from the high refractive index substrate (such as a sapphire substrate having n of 2.5) at the top of LED1, may likely deteriorate. It is more preferably at least 1.7, particularly preferably at least 1.85, most preferably at least 2.0. Further, n of such glass is typically at most 2.3.

The refractive index at a wavelength of 633 nm of the glass to be used for the sealing glass 7 is preferably at least 1.7.

The temperature $T_F$ at which the viscosity of the glass to be used for the sealing glass 7 becomes $10^5$ P, is preferably at most 500° C. If it exceeds 500° C., bubbles remaining in the sealing glass 7 obtained by softening and flowing this glass to seal LED 1, tend to be many, and the light transmittance may likely deteriorate. It is more preferably at most 450° C., particularly preferably at most 400° C., most preferably at most 380° C.

It is preferred that α of the glass to be used for the sealing glass 7 is from $75\times10^{-7}$ to $140\times10^{-7}$/° C. If it is outside this range, it may likely be difficult to let the expansion match, for example, when LED1 is InGaN LED, α thereof is typically $85\times10^{-7}$/° C. It is more preferably at most $135\times10^{-7}$/° C.

It is preferred that the crystallization temperature ($T_C$) of the glass to be used for the sealing glass 7 is more than 400° C. If $T_C$ is 400° C. or lower, crystals tend to be precipitated in a large amount in the glass at the time of sealing which is typically carried out at a temperature of at most 450° C., whereby the light transmittance may likely deteriorate. It is more preferably at least 420° C., further preferably at least 450° C., particularly preferably at least 550° C., most preferably higher than 600° C. Here, in the present invention, the crystallization temperature is meant for the crystallization initiation temperature at the time when the crystallization peak is observed when the glass is powdered and subjected to a differential thermal analysis from room temperature to 600° C. at a temperature raising rate of 10° C./min, and a case wherein no crystallization peak is observed, is designated as "higher than 600° C".

$T_C$ is higher than ($T_S$+60° C.), more preferably higher than ($T_S$+90° C.)

Further, $T_C$ of the glass to be used for the sealing glass 7 is preferably higher than $T_F$, more preferably higher than ($T_F$+ 40° C.), particularly preferably higher than ($T_F$+60° C.)

The light transmittance (internal transmittance) at a wavelength of from 400 to 750 nm with a thickness of 2 mm, of the glass to be used for the sealing glass 7, is preferably at least 70%. The light transmittance at a wavelength of 360 to 750 nm with a thickness of 2 mm, of the glass to be used for the sealing glass 7, is more preferably at least 70%.

Now, the components of the glass to be used for the sealing glass 7 in the first aspect of the present invention will be described. Here, unless otherwise specified, "mol %" will be represented simply by "%" to describe the glass composition below.

SnO is a network former of glass and is essential. If it is less than 30%, the glass tends to be instable. It is preferably at least 45%. If it exceeds 70%, the glass rather tends to be instable, or $T_S$ or $T_F$ tends to be so high that sealing of LED1 tends to be difficult.

$P_2O_5$ is a network former of the glass and is essential. If it is less than 15%, the glass tends to be instable. If it exceeds 50%, the glass rather tends to be instable. In a case where the sealing glass 7 will be in contact with the atmosphere, it is preferred to adjust $P_2O_5$ to be preferably at most 45%, more preferably at most 40%, to improve the water resistance.

ZnO is a component incorporated, for example, to stabilize the glass and is essential. If it is less than 0.1%, the glass tends to be instable. It is preferably at least 3%. If it exceeds 20, $T_S$ tends to be high. It is preferably at most 13%.

The total of the contents of SnO and ZnO is preferably from 1.8 to 2.2 times the content of $P_2O_5$. If the total content is outside this range, the glass tends to be instable, and it is more preferably from 1.9 to 2.1 times.

Each of $SiO_2$ and $GeO_2$ is not essential, but they may be incorporated in a total amount of up to 10% to stabilize the glass, to improve the water resistance, etc. If they exceed 10%, $T_S$ is likely to be high.

Each of $Li_2O$, $Na_2O$ and $K_2O$ is not essential, but they may be incorporated in a total amount of up to 30%, for example, to lower $T_S$. If they exceed 30%, the glass is likely to be instable. In a case where the sealing glass 7 will be in contact with the atmosphere, it is preferred to adjust the total content of $Li_2O$, $Na_2O$ and $K_2O$ to be at most 10% thereby to improve the water resistance.

Each of MgO, CaO, SrO and BaO is not essential, but they may be incorporated in a total amount of up to 20% to stabilize the glass, to improve the water resistance, etc. If they exceed 20%, $T_S$ is likely to be high.

The glass to be used for the sealing glass 7 in the first aspect of the present invention, consists essentially of the above components, but it may contain other components within a range not to impair the purpose of the present invention. In a case where such other components are incorporated, their total amount is preferably at most 15%, more preferably at most 7%.

The first aspect of the present invention is suitable when it is desired to shift the ultraviolet absorption end of the glass to be used for the sealing glass 7 to a shorter wavelength side (for example, at most 350 nm), to bring the internal transmittance to be to at least 80% or to make $T_S$ to be lower.

The following glass A may, for example, be mentioned as glass to be used for the sealing glass 7 in the first aspect of the present invention. Here, the refractive index at a wavelength of 633 nm was measured as follows. Namely, a plate sample having both sides mirror-polished and having a size of 2 cm×2 cm and a thickness of 1 mm, was prepared, and the refractive index was measured by using a refractive index measuring apparatus Model 12010 PRISM COUPLER (tradename), manufactured by Metricon.

Glass A
  Composition: SnO 62%, $P_2O_5$ 33%, ZnO 5%.
  Glass Transition Point ($T_G$): 262° C.
  $T_S$: 322° C.
  n: 1.8 (estimated value).
  Refractive Index at a Wavelength of 633 nm: 1.77.
  $T_F$: 360° C. (estimated value)
  α: 135×10-7/° C.
  $T_C$: higher than 600° C.
  Internal Transmittance at a Wavelength of 400 nm with a Thickness of 2 mm: 97%.

Now, components of glass to be used for the sealing glass 7 in the second aspect of the present invention will be described.

$B_2O_3$ is a network former of the glass and is essential. If it is less than 20%, the glass tends to be instable. If it exceeds 55%, $T_S$ tends to be so high that sealing of LED1 tends to be difficult.

$Bi_2O_3$ is a network former of the glass and is a component to increase n and thus essential. If it is less than 1%, the glass tends to be instable, or n tends to be low. If it exceeds 20%, the above-mentioned light transmittance, particularly the internal transmittance at a wavelength of 380 nm, tends to be low, for example is likely to be less than 70%.

ZnO is not essential, but may be incorporated up to 30%, for example, to stabilize the glass. If it exceeds 30%, $T_S$ tends to be high.

Each of $SiO_2$ and $GeO_2$ is not essential, but they may be incorporated in a total amount of up to 20%, for example, to stabilize the glass or to improve the water resistance. If they exceed 20%, $T_S$ is likely to be high.

Each of $Li_2O$, $Na_2O$ and $K_2O$ is not essential, but they may be incorporated in a total amount of up to 30%, for example, to lower $T_S$. If they exceed 30%, the glass is likely to be instable. In a case where the sealing glass 7 will be in contact with the atmosphere, it is preferred to adjust the total content of $Li_2O$, $Na_2O$ and $K_2O$ to be at most 10% thereby to improve the water resistance.

Each of MgO, CaO, SrO and BaO is not essential, but they may be incorporated in a total amount of up to 30%, for example, to stabilize the glass or to improve the water resistance. If they exceed 30%, $T_S$ is likely to be high.

The glass to be used for the sealing glass 7 in the second aspect of the present invention, consists essentially of the above components. However, it may contain other components within a range not to impair the purpose of the present invention. In a case where such other components are incorporated, their total content is preferably at most 15%, more preferably at most 7%.

The second aspect of the present invention is suitable in a case where it is desired to shift the ultraviolet absorption end of the glass to be used for the sealing glass 7 to a short wavelength side (for example at most 380 nm), to bring the above internal transmittance to be at least 70% or to increase n, for example, to a level of 1.6.

Now, components of the glass to be used for the sealing glass 7 in the third aspect of the present invention will be described.

$TeO_2$ is a network former of the glass and is essential. If it is less than 20%, it tends to be difficult to obtain glass having large n. It is preferably at least 40%. If it exceeds 70%, vitrification rather tends to be difficult.

ZnO is a component, for example, to stabilize the glass and is essential. If it is less than 3%, it tends to be difficult to obtain homogeneous glass. It is preferably at least 5%, more preferably at least 11%. If it exceeds 30%, $T_S$ tends to be high.

$B_2O_3$ is not essential, but may be incorporated up to 55%, for example, to stabilize the glass or to increase the internal transmittance at a wavelength of 380 nm. If it exceeds 55%, $T_S$ tends to be high, and sealing of LED1 tends to be difficult.

Each of $SiO_2$ and $GeO_2$ is not essential, but they may be incorporated in a total amount of up to 10%, for example, to stabilize the glass or to improve the water resistance. If they exceed 10%, $T_S$ is likely to be high.

Each of $Li_2O$, $Na_2O$ and $K_2O$ is not essential, but they may be incorporated in a total amount of up to 30%, for example, to lower $T_S$. If they exceed 30%, the glass is likely to be instable. In a case where the sealing glass 7 will be in contact with the atmosphere, it is preferred to adjust the total content of $Li_2O$, $Na_2O$ and $K_2O$ to be at most 10% thereby to improve the water resistance.

Each of MgO, CaO, SrO and BaO is not essential, but they may be incorporated in a total amount of up to 20%, for example, to stabilize the glass or to improve the water resistance. If they exceed 20%, $T_S$ is likely to be high.

The glass to be used for the sealing glass 7 in the third aspect of the present invention, consists essentially of the above components, but it may contain other components within a range not to impair the purpose of the present invention. In a case where such other components are to be incorporated, their total amount is preferably at most 15%, more preferably at most 7%.

For example, $Y_2O_3$ may be incorporated up to 5% for the purpose of making n to be higher.

The third aspect of the present invention is suitable in a case where it is desired to increase n of the glass to be used for the sealing glass 7, for example, to a level of at least 1.65.

Glasses B1 to B4 as identified in Table 1 may, for example, be mentioned as the glass to be used for the sealing glass 7 in the third aspect of the present invention. The lines from $TeO_2$ to $Y_2O_3$ show the composition as represented by mol %; the units for $T_G$ and $T_C$ are °C.; the unit for α is $10^{-7}/°$ C.; and the internal transmittance is a value (unit: %) at a wavelength of 400 nm with a thickness of 2 mm. Further, $T_C$ and α are estimated values calculated from the composition.

TABLE 1

|  | B1 | B2 | B3 | B4 |
| --- | --- | --- | --- | --- |
| $TeO_2$ | 57 | 65 | 65 | 65 |
| ZnO | 27 | 17.5 | 15 | 12.5 |
| $GeO_2$ | 5 | 5 | 5 | 5 |
| $Na_2O$ | 8 | 5 | 5 | 5 |
| BaO | 0 | 5 | 7.5 | 10 |
| $Y_2O_3$ | 3 | 2.5 | 2.5 | 2.5 |
| $T_G$ | 335 | 335 | 335 | 335 |
| n | 2.02 | 2.08 | 2.08 | 2.08 |
| Refractive index (wavelength 633 nm) | 1.93 | 1.98 | 1.98 | 1.98 |
| α | 115 | 130 | 130 | 130 |
| $T_C$ | 550 | 500 | 500 | 500 |
| Internal transmittance | 97 | 97 | 97 | 97 |

The LED element of the present invention preferably takes a flip chip system as shown in FIG. 1 and is preferably one not taking a wire bonding system.

The following test was carried out to ascertain whether or not there is a problem when the above glass A is used for sealing of LED having sapphire as the substrate.

Firstly, the glass A was melted, and a small portion thereof was dropped on a carbon plate and cooled to obtain a glass ball having a diameter of about 4 mm.

On the other hand, a Petri dish-form aluminum pan (diameter: 5 mm, height 5 mm) as an attachment to a differential thermal analysis apparatus TG/DTA6300 manufactured by Seiko Instruments Inc., was ready, and at its center, an alumina plate simulating LED (size: 2 mm×2 mm, thickness: 1 mm) was placed, and the above glass ball was mounted on the alumina plate.

Then, using an electric furnace, the set was maintained at 400° C. for 1 hour and then cooled naturally. After the cooling, the aluminum pan was taken out, and it was found that the glass ball was softened and flowed to seal the alumina plate, and the sealed glass had an extremely high transparency and no bubbles or cracks were observed therein.

Further, the above alumina plate was made of highly pure alumina, and its α was $85×10^{-7}/°$ C. which was close to α of sapphire to be used for the substrate of LED, and it is considered sufficient as a simulation of LED.

Now, the fourth and fifth aspects of the present invention directed to a LED element wherein α of the substrate is from $70×10$ to $90×10^{-7}/°$ C., whereby a problem due to mismatching of the expansion coefficient scarcely occurs (hereinafter these aspects of the present invention may be sometimes generally referred to as the present invention), and the glass of the present invention suitable as glass for covering a LED element in these aspects of the present invention, will be described.

Figure 2:
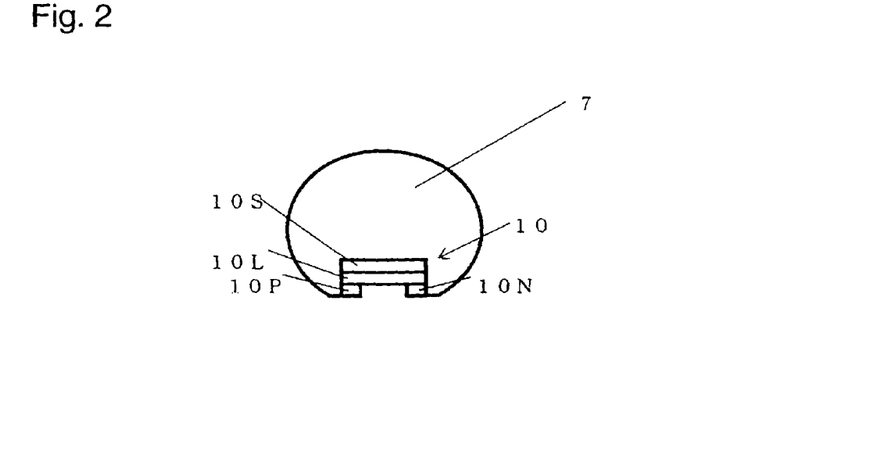
FIG. 2 is a schematic view showing the cross section of another embodiment of the LED element of the present invention.
Figure 3:
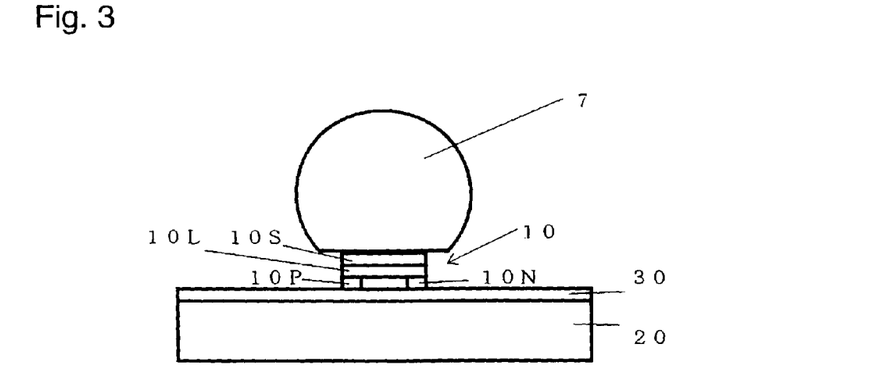
FIG. 3 is a cross-sectional schematic view illustrating a method for producing the LED element of the present invention.

FIG. 2 is a schematic view of the cross section of the LED element of the present invention, and FIG. 3 is a schematic view illustrating an example of the method for preparing the LED element of the present invention, and they show the disposition and cross sections of the respective components. Hereafter, the present invention will be described with reference to these Figs., but it should be understood that present invention is by no means thereby restricted.

As illustrated in FIG. 2, the glass-covered LED element of the present invention comprises a LED element 10 and glass (LED element-covering glass) 7 covering it.

The LED element 10 comprises a substrate 10S, LED 10L, p electrode 10P and n electrode 10N, as constituting components.

LED10L is typically LED which emits ultraviolet light or blue light having a wavelength of from 360 to 480 nm and may, for example, be LED of a quantum well structure (InGaN LED) having a luminous layer made of InGaN having In added to GaN. In a case where LED 10L is InGaN LED, the portions in contact with the p electrode 10P and the n electrode 10N are a p-type semiconductor and a n-type semiconductor, respectively.

LED10L is formed on one side of the substrate 10S. In FIG. 2, the side of LED10L opposite to the side on which the p electrode 10P and the n electrode 10N are formed, is in contact with the substrate 10S.

The substrate 10S has α of from $70 \times 10^{-7}$ to $90 \times 10^{-7}/°$ C., but typically, α is from $75 \times 10^{-7}$ to $85 \times 10^{-7}/°$ C. Usually, as the substrate 10S, a sapphire substrate having α of about $80 \times 10^{-7}/°$ C. is used.

Each of the p electrode 10P and the n electrode 10N is typically made of gold and electrically connected to a p electrode portion and a n electrode portion (not shown) of LED10L usually via a buffer layer.

$T_S$ of the glass 7 is at most 500° C. If it exceeds 500° C., the temperature for the heat treatment to cover the LED element 10 by the glass 7 will be too high, and the light-emitting function of the LED element 10 is likely to be impaired. It is preferably at most 490° C.

For the same reason, Tg of the glass 7 is preferably at most 450° C.

The glass 7 has α of from $65 \times 10^{-7}$ to $95 \times 10^{-7}/°$ C. If α is outside this range, mismatching in the expansion coefficient with the substrate 10S tends to be too large. In a case where the substrate 10S is one having α of from $75 \times 10^{-7}$ to $85 \times 10^{-7}/°$ C. such as a sapphire substrate, α of the glass 7 is preferably from $70 \times 10^{-7}$ to $90 \times 10^{-7}/°$ C.

The glass 7 covers at least the substrate 10S.

Since n of the glass 7 is at least 1.7 in the LED element of the fifth aspect of the present invention (hereinafter referred to as the second LED element) and at least 2.0 in the LED element of the fourth aspect of the present invention (hereinafter referred to as the first LED element), return of light to the substrate 10S by reflection is suppressed even in a case where the substrate 10S has large n like a sapphire substrate (n: about 2.5), whereby the light-withdrawing efficiency from the substrate 10S can be made high.

In the second LED element, n of the glass 7 is preferably at least 1.9, more preferably at least 2.0.

$T_{405}$ of the glass 7 is at least 80%, whereby it is possible to suppress the reduction of light quantity by light absorption and to increase the light-withdrawing efficiency. It is preferably at least 85%, more preferably at least 90%, particularly preferably at least 93%.

The glass 7 is one containing no PbO in the second LED element. Also in the first LED element, it is preferably one containing no PbO.

The glass 7 may, for example, be a $TeO_2$—$B_2O_3$—$ZnO$ type glass which contains $TeO_2$ in an amount of from 40 to 53%.

In the $TeO_2$—$B_2O_3$—$ZnO$ type glass, if $TeO_2$ is less than 40%, n tends to be small, or $T_S$ tends to be high. It is preferably at least 43%. If it exceeds 53%, α tends to be large. It is typically at most 51%.

The above exemplified $TeO_2$—$B_2O_3$—$ZnO$ type glass is preferably the glass of the present invention. Otherwise, it is preferably glass which consists essentially of, based on the following oxides, from 42 to 58% of $TeO_2+GeO_2$, from 15 to 35% of $B_2O_3+Ga_2O_3+Bi_2O_3$, from 3 to 20% of ZnO, and from 1 to 15% of $Y_2O_3+La_2O_3+Gd_2O_3+Ta_2O_5$, wherein $TeO_2+B_2O_3$ is at most 75 mol %.

Now, an example of the method for producing one as shown in FIG. 2 which is a LED element of the present invention, will described with reference to FIG. 3.

Firstly, glass 7 having a shape as shown in FIG. 3 i.e. glass 7 having a shape such that a part of a ball is cut off so that the cut surface is flat, is prepared as follows. Namely, on a heat resistant plate, a release agent powder is sprayed to form a release agent layer. On such a release agent layer, a small piece of glass 7 is placed and heated to a temperature of at least $T_S$ of the glass 7 to soften and flow the glass 7 so that it will be substantially spherical by the surface tension. Substantially spherical glass 7 thus obtained is flat at the portion in contact with the release agent layer, and its shape is one having a part of a ball cut off, so that the cut surface is flat. Here, the heat resistant plate may, for example, be a silicon wafer, and the release agent powder may, for example, be a boron nitride powder.

Then, on the release agent layer 30 formed on the heat resistant plate 20, the LED element 10 is placed so that the substrate 10S faces upward. Here, one having the release agent layer 30 formed on the heat resistant plate 20 may be one used to prepare the glass 7 having the above-mentioned shape.

On the LED element 10, the glass 7 having the above-mentioned shape prepared as described above, is placed and heated to a temperature of at least $T_S$ of the glass 7 to soften and flow the glass 7 to cover at least the portion of the substrate 10S of the LED element 10. In FIG. 3, the side surface of the LED element 10 is also covered.

Now, the glass of the present invention will be described.

$T_{405}$ of the glass of the present invention is preferably at least 85%, more preferably at least 90%, particularly preferably at least 93%.

$T_S$ of the glass of the present invention is preferably at most 500° C., more preferably at most 490° C.

α of the glass of the present invention is preferably from $65 \times 10^{-7}$ to $95 \times 10^{-7}/°$ C., typically from $75 \times 10^{-7}$ to $85 \times 10^{-7}/°$ C.

n of the glass of the present invention is preferably at least 1.7, more preferably at least 1.9, particularly preferably at least 2.0.

The glass of the present invention preferably has $T_S$ of at most 500° C., α of from $65 \times 10^{-7}$ to $95 \times 10^{-7}/°$ C. and n of at least 1.7.

The glass of the present invention is preferably one which can be prepared by melting at a temperature of at most 980° C. Otherwise, it will be difficult to melt the glass by using a metal crucible (melting point: 1,063° C.), and it will be required to carry out melting by means of a crucible made of platinum or a platinum alloy, and consequently, platinum will be dissolved in the glass, whereby $T_{405}$ tends to be low.

Now, the composition of the glass of the present invention will be described.

$TeO_2$ is a network former of the glass and is essential. If it is less than 40%, n tends to be small, or $T_S$ tends to be high. It is preferably at least 43%. If it exceeds 53%, α tends to be large. It is preferably at most 51%.

$GeO_2$ is not essential, but may be incorporated up to 10% to form the glass skeleton, to increase $T_{405}$, to stabilize the glass or to suppress devitrification. If it exceeds 10%, $T_S$ tends to be high. It is preferably at most 7%. When $GeO_2$ is contained, its content is preferably at least 1%, more preferably at least 3%.

The total content of $TeO_2$ and $GeO_2$ is preferably from 42 to 58%. If it is less than 42%, the glass is likely to be instable. It is more preferably at least 45%. If it exceeds 58%, α tends to be large, or $T_S$ tends to be high. It is more preferably at most 55%.

$B_2O_3$ is a component to form the glass skeleton and is essential. If it is less than 5%, the glass tends to be instable. It is preferably at least 10%. If it exceeds 30%, n tends to be small, or chemical durability such as water resistance tends to be low. It is preferably at most 20%.

The total content of $TeO_2$ and $B_2O_3$ is at most 75%. If it exceeds 75%, α tends to be large. It is preferably at most 70%.

$Ga_2O_3$ is not essential, but may be incorporated up to 10% to increase n. If it exceeds 10%, the glass tends to be instable. It is preferably at most 8%. When $Ga_2O_3$ is contained, its content is preferably at least 1%, more preferably at least 3%.

$Bi_2O_3$ is not essential, but may be incorporated up to 10% to increase n. If it exceeds 10%, $T_{405}$ tends to be low. It is preferably at most 5%. When $Bi_2O_3$ is contained, its content is preferably at least 0.1%, more to preferably at least 0.5%.

The total content of $B_2O_3$, $Ga_2O_3$ and $Bi_2O_3$ is preferably from 15 to 35%. If it is less than 15%, vitrification is likely to be difficult. It is more preferably at least 20%. If it exceeds 35%, the glass is likely to be instable. It is more preferably at most 30%.

ZnO is a component to stabilize the glass and is essential. If it is less than 3%, the glass tends to be instable. It is preferably at least 5%, more preferably at least 10%. If it exceeds 20%, it will be required to melt it at a temperature exceeding 980° C. It is preferably at most 19%.

$Y_2O_3$ is not essential, but may be incorporated up to 3%, for example, to suppress devitrification. If it exceeds 3%, n tends to be small. It is preferably at most 1%. When $Y_2O_3$ is contained, its content is preferably at least 0.1%, more preferably at least 0.5%.

$La_2O_3$ is not essential, but may be incorporated up to 3%, for example, to suppress devitrification. If it exceeds 3%, n tends to be small. It is preferably at most 1%. When $La_2O_3$ is contained, its content is preferably at least 0.1%, more preferably at least 0.5%.

$Gd_2O_3$ is not essential, but may be incorporated up to 7%, for example, to suppress devitrification. If it exceeds 7%, $T_S$ tends to be high. It is preferably at most 5%. When $Gd_2O_3$ is contained, its content is preferably at least 1%, more preferably at least 3%.

$Ta_2O_5$ is not essential, but may be incorporated up to 5% to increase n. If it exceeds 5%, $T_S$ tends to be high. It is preferably at most 4%. When $Ta_2O_5$ is contained, its content is preferably at least 1%, more preferably at least 2%.

The total content of $Y_2O_3$, $La_2O_3$, $Gd_2O_3$ and $Ta_2O_5$ is preferably from 1 to 15%. If it is less than 1%, devitrification is likely to take place. It is more preferably at least 3%. If it exceeds 15%, vitrification is likely to be difficult. It is more preferably at most 10%.

It is preferred that $TeO_2+GeO_2$ is from 42 to 58%, $B_2O_3+Ga_2O_3+Bi_2O_3$ is from 15 to 35%, and $Y_2O_3+La_2O_3+Gd_2O_3+Ta_2O_5$ is from 1 to 15%.

The glass of the present invention consists essentially of the above components, but may contain other components within a range not to impair the purpose of the present invention. In a case where such components are incorporated, the total content of such components is preferably at most 10%, more preferably at most 5%. As such other components, $TiO_2$ may, for example, be mentioned. $TiO_2$ may be incorporated when it is desired to adjust n or to prevent solarization. If its content exceeds 2%, $T_{405}$ tends to be low, or α tends to be large. It is typically at most 1.3%.

Further, the glass of the present invention may contain an alkali metal oxide, for example, to lower $T_S$. However, such an alkali metal oxide is likely to cause an electrical problem, and its content is preferably less than 1%, and usually, no alkali metal oxide is incorporated.

Further, the glass of the present invention preferably contains no PbO.

Now, the present invention will be described in further detail with reference to Examples. However, it should be understood that the present invention is by no means thereby restricted.

With respect to Examples 1 to 13, raw materials were blended to prepare 450 g of a blend material having a composition shown by mol % in the lines from $TeO_2$ to $Na_2O$ in the Tables, and the blend material was put into a gold crucible having a capacity of 300 cc and melted at 950° C. for 2.5 hours. At that time, stirring was carried out for 1 hour by a gold stirrer to homogenize the molten glass. The homogenized molten glass was cast in a carbon mold to form it into a plate shape.

With respect to Example 11, after casting the molten glass, glass deposited on the inner wall of the gold crucible was naturally cooled in the atmosphere, and small glass pieces deposited on the inner wall were then collected.

With respect to Example 14, the molten glass was formed into a plate shape in the same manner as in Example 1 to 13, but devitrification was remarkable. Therefore, melting was carried out as follows. Namely, 100 g of a blend material was prepared, put into a gold crucible having a capacity of 100 cc and melted at 995° C. for 1 hour. At that time, no stirring by a gold stirrer was carried out, since the melting temperature was close to the melting point of gold, and it was feared that the shape might not be maintained. The inadequately homogenized molten glass thus obtained was cast to form it into a plate shape, followed by annealing.

Examples 1 to 12 represent Examples for the glass of the present invention, and Examples 13 and 14 represent Comparative Examples to the glass of the present invention.

With respect to each glass obtained, $T_S$ (unit: ° C.), $T_g$ (unit: ° C.), α (unit: $10^{-7}$/° C.), n and $T_{405}$ (unit: %) were measured. The measurement methods thereof will be described below.

$T_S$: A sample processed into a cylinder having a diameter of 5 mm and a length of 20 mm was measured at a temperature raising rate of 5° C./min by means of a thermomechanical analyzer DILATOME5000 (tradename), manufactured by McScience. With respect to Example 7, not a measured value, but a value estimated from the composition is shown together with an estimated precision. With respect to Example 14, neither measurement nor estimation was carried out.

Tg: 150 mg of a sample processed into a powder was packed into a platinum pan and measured by means of a thermal analyzer TG/DTA6300 (tradename), manufactured by Seiko Instruments, Inc.

α: A sample processed into a cylinder having a diameter of 5 mm and a length of 20 mm was measured at a temperature raising rate of 5° C./min by means of the above-mentioned thermomechanical analyzer. The expansion coefficient was obtained every 25° C. within a range of from 50 to 300° C., and the average value was taken as α. With respect to Example 7, not measured value, but a value estimated from the composition is shown together with an estimated precision.

n: Glass is processed into a triangular prism having 30 mm on a side and 10 mm in thickness and measured by means of a precision spectrometer GMR-1 (tradename) manufactured by Kalnew Optical.

$T_{405}$: Two plate-shaped glass samples having thicknesses of 1 mm and 5 mm and a size of 2 cm×2 cm and having each side mirror-polished, were prepared, and the transmittance for light having a wavelength of 405 nm was measured by means of a spectrophotometer U-3500 (tradename) manufactured by Hitachi Ltd. The transmittances of the plate shaped samples having thicknesses of 1 mm and 5 mm obtained by the measurements are represented by T1 and T5, respectively, and $T_{405}$ (unit: %) is calculated by the following formula.

$$T_{405}=100\times\exp[(2/3)\times\log_e(T5/T1)]$$

Further, with respect to Examples 9, 11, 13 and 14, in accordance with the evaluation method prescribed by Japan Optical Glass Industry Association, water resistance RW and acid resistance RA were evaluated as follows. The grades are shown in the corresponding columns in the Tables.

RW: Glass particles having a diameter of from 420 to 600 μm were prepared, and the mass reduction ratio when they were immersed in 80 ml of pure water at 100° C. for 1 hour, was measured. The mass reduction ratio being less than 0.05 was rated as grade 1; at least 0.05 and less than 0.10 as grade 2; at least 0.10 and less than 0.25 as grade 3; at least 0.25 and less than 0.60 as grade 4; at least 0.60 and less than 1.10 as grade 5; and at least 1.10 as grade 6. RW is preferably grade 1.

RA: Glass particles having a diameter of from 420 to 600 μm were prepared, and the mass reduction ratio when they were immersed in 80 ml of a 0.01 N nitric acid aqueous solution at 100° C. for 1 hour, was measured. The mass reduction ratio being less than 0.20 was rated as grade 1; at least 0.20 and less than 0.35 as grade 2; at least 0.35 and less than 0.65 as grade 3; at least 0.65 and less than 1.20 as grade 4; at least 1.20 and less than 2.20 as grade 5: and at least 2.20 as grade 6. RA is preferably grade 1.

TABLE 2

|  | Ex. 1 | Ex. 2 | Ex. 3 | Ex. 4 | Ex. 5 | Ex. 6 | Ex. 7 |
| --- | --- | --- | --- | --- | --- | --- | --- |
| $TeO_2$ | 51.0 | 47.0 | 46.8 | 46.0 | 45.0 | 46.0 | 47.0 |
| $GeO_2$ | 4.0 | 3.0 | 3.0 | 3.0 | 5.0 | 5.0 | 5.0 |
| $B_2O_3$ | 19.0 | 19.0 | 19.0 | 19.0 | 19.0 | 19.0 | 19.0 |
| $Ga_2O_3$ | 5.0 | 5.0 | 5.0 | 5.0 | 6.0 | 6.0 | 6.0 |
| $Bi_2O_3$ | 0 | 5.0 | 5.0 | 5.0 | 4.0 | 3.0 | 2.0 |
| ZnO | 15.0 | 15.0 | 15.0 | 15.0 | 15.0 | 15.0 | 15.0 |
| $Y_2O_3$ | 0.5 | 0.5 | 0.5 | 0.5 | 0.5 | 0.5 | 0.5 |
| $La_2O_3$ | 0.5 | 0.5 | 0.5 | 0.5 | 0.5 | 0.5 | 0.5 |
| $Gd_2O_3$ | 3.0 | 3.0 | 3.0 | 3.0 | 3.0 | 3.0 | 3.0 |
| $Ta_2O_3$ | 2.0 | 2.0 | 2.0 | 2.0 | 2.0 | 2.0 | 2.0 |
| $TiO_2$ | 0 | 0 | 0.2 | 1.0 | 0 | 0 | 0 |
| $Na_2O$ | 0 | 0 | 0 | 0 | 0 | 0 | 0 |
| $T_s$ | 476 | 478 | 478 | 479 | 487 | 486 | 485 ± 10 |
| Tg | 430 | 430 | 430 | 435 | 440 | 440 | 440 |
| α | 86 | 91 | 90 | 89 | 87 | 86 | 86 ± 3 |
| n | 1.972 | 2.034 | 2.034 | 2.038 | 2.008 | 1.997 | 1.986 |
| $T_{405}$ | 99 | 96.7 | 95.9 | 91.3 | 98.4 | 99.0 | 98.7 |
| RW | — | — | — | — | — | — | — |
| RA | — | — | — | — | — | — | — |

TABLE 3

|  | Ex. 8 | Ex. 9 | Ex. 10 | Ex. 11 | Ex. 12 | Ex. 13 | Ex. 14 |
| --- | --- | --- | --- | --- | --- | --- | --- |
| $TeO_2$ | 45.2 | 45.0 | 44.8 | 45.0 | 45.0 | 51.0 | 54.0 |
| $GeO_2$ | 5.0 | 5.0 | 5.0 | 5.0 | 3.0 | 0 | 5.0 |
| $B_2O_3$ | 19.0 | 19.0 | 19.0 | 18.0 | 19.0 | 29.0 | 0 |
| $Ga_2O_3$ | 6.0 | 6.0 | 6.0 | 6.0 | 5.0 | 0 | 0 |
| $Bi_2O_3$ | 3.0 | 3.0 | 3.0 | 3.0 | 5.0 | 0 | 0 |
| ZnO | 15.0 | 15.0 | 15.0 | 15.0 | 15.0 | 15.0 | 30.0 |
| $Y_2O_3$ | 0.5 | 0.5 | 0.5 | 0.5 | 0.5 | 2.0 | 3.0 |
| $La_2O_3$ | 0.5 | 0.5 | 0.5 | 0.5 | 0.5 | 2.0 | 0 |
| $Gd_2O_3$ | 3.0 | 3.0 | 3.0 | 3.0 | 3.0 | 1.0 | 0 |
| $Ta_2O_3$ | 2.0 | 2.0 | 2.0 | 3.0 | 2.0 | 0 | 0 |
| $TiO_2$ | 0.8 | 1.0 | 1.2 | 1.0 | 2.0 | 0 | 0 |
| $Na_2O$ | 0 | 0 | 0 | 0 | 0 | 0 | 8.0 |
| $T_s$ | 485 | 490 | 489 | 490 | 485 | 465 | — |
| Tg | 440 | 440 | 440 | 445 | 445 | 420 | 335 |
| α | 85 | 86 | 86 | 86 | 87 | 105 | >120 |
| n | 2.001 | 2.001 | 2.001 | 2.011 | 2.041 | 1.948 | 2.01 |
| $T_{405}$ | 94.2 | 94.9 | 93.6 | 95.2 | 86.6 | 99 | 98.0 |
| RW | — | 1 | — | 1 | — | 1 | 3 |
| RA | — | 1 | — | 1 | — | 2 | 3 |

Example 1

Using the above-mentioned small pieces of glass in Example 11, a LED element covered with glass was prepared by the method as described above with reference to FIG. 3.

As a heat resistant plate, a 6 inch silicon wafer manufactured by Osaka Titanium was used, and as a release agent powder, boron nitride powder Boron Spray manufactured by Kaken Kogyo Co., Ltd. was sprayed thereon. The boron nitride powder layer was made to have a thickness such that the silicon wafer surface was not seen.

A small piece of glass having a weight of about 30 mg was placed on the boron nitride powder layer on the silicon wafer and heated form 25° C. to 610° C. at a rate of 5° C. per minute by means of a muffle furnace FP41 manufactured by Yamato Scientific Co., Ltd. and maintained at that temperature for 15 minutes. Then, it was cooled at a rate of 5° C. per minute to obtain glass B having a shape as shown by symbol 7 in FIG. 3. With this glass, the height was 1.9 mm, the maximum value of the width in a horizontal direction was 2.0 mm, and the diameter of the flat portion (circular shape) of the bottom surface was 0.8 mm.

Then, on the silicon nitride powder layer on the silicon wafer, many blue emitting LED bare chips GB-3070 manufactured by Showa Denko K.K. were applied from a height of about 3 cm.

The LED bare chip is one having InGaN formed as a semiconductor layer on a sapphire substrate, and its size is 300 μm×300 μm, and the thickness is 80 μm. On the side opposite to the sapphire substrate, a p electrode and a n electrode, each having the surface made of gold, are formed, and each electrode is circular with a diameter of 110 μm.

Among the applied bare chips, one having the electrode-forming side in contact with the boron nitride powder layer and having the sapphire substrate at the top, is selected, and the above-mentioned glass B is placed so that the center of the bottom surface thereof will be located on the sapphire substrate, followed by the same heat treatment as in the case of preparing the above glass B. As a result, a glass-covered LED element having the sapphire substrate covered by glass as shown in FIG. 2 and having the bare chip embedded in the glass, was obtained. The dimensions such as the height and the maximum value of width in the horizontal direction, of the covered glass, were substantially the same as the glass B, and no glass was deposited on the electrode-formed surface.

Across the p electrode and the n electrode of this glass covered LED element, a voltage of 3.5 V was applied by a manual prova by means of a DC power source MC35-1A manufactured by Kikusui Electronics Corp., whereby light emission was observed.

Example 2

A LED element covered with glass was prepared by a method different from Example 1.

Firstly, on an alumina substrate (thickness: 1 mm, size: 50 mm×100 mm) having a gold circuit pattern formed, LED manufactured by Toyoda Gosei Co., Ltd. (tradename: E1060-0B011-03) was flip chip-mounted.

On the other hand, a glass plate of Example 11 having a thickness of 1.5 mm and a size of 3 mm×3 mm, was prepared, and its both sides were mirror-polished.

This mirror-polished glass plate was placed on LED on the alumina substrate having the above LED flip chip-mounted, and the temperature was raised to 610° C. at a rate of 1° C. per minute and maintained at that level for 15 minutes to soften and flow the glass plate to cover LED. Cooling was carried out at a rate of 1° C. per minute to about 400° C., and at a lower temperature range, the set was left to naturally cool in the furnace.

The thickness of the cover glass of the obtained glass-covered LED element was about 1.7 mm, and its maximum value of width in the horizontal direction was 2.2 mm.

The cover glass and LED were found to be closely bonded by visual observation. Further, bubbles in the cover glass were little, and only a few having a diameter of about 10 μm were found as observed by an optical microscope.

With respect to this glass covered LED element, the emission intensity was measured by a constant current measurement at 20 mA by means of LED tester LX4681A (tradename) manufactured by Teknologue Co., Ltd.

Comparative Example 1

For the purpose of comparison, an alumina substrate having the above LED flip chip-mounted, was separately prepared, and without covering by glass, with respect to the LED, the emission intensity was measured in the same manner as in Example 2, whereby the ratio in the emission intensity of Comparative Example 1 to Example 2 was 0.69:1.00. Namely, the emission intensity of the LED element of the present invention covered by glass was 1.45 times that of the non-covered LED element.

Comparative Example 2

For the purpose of comparison, a resin covered LED element was prepared as follows.

Firstly, an alumina substrate having the above LED flip chip-mounted, was separately prepared.

Then, about 25 ml of a silicone resin precursor LPS3400 (tradename) for LED manufactured by Shin-Etsu Chemical Co., Ltd. in a gel form, was dropped on LED on the above alumina substrate and thereafter maintained at 100° C. for 1 hour and further maintained at 150° C. for 1 hour to let the silicone resin precursor undergo a polymerization reaction thereby to have LED covered by the silicone resin (n=1.410).

With respect to the resin covered LED element thus obtained, the emission intensity was measured in the same manner as in Example 2, whereby the ratio in the emission intensity of Comparative Example 2 to Example 2 was 0.83:1.00. Namely, the emission intensity of the glass covered LED element of the present invention was 1.21 times that of the resin covered LED element.

The LED element of the present invention can be used as a blue LED element. Further, it can be used as a white LED element if a phosphor powder emitting a yellow fluorescence using a blue color as excitation light, is incorporated into the glass.

The entire disclosures of Japanese Patent Application No. 2005-118413 filed on Apr. 15, 2005 and Japanese Patent Application No. 2005-254906 filed on Sep. 2, 2005 including specifications, claims, drawings and summaries are incorporated herein by reference in their entireties.

What is claimed is:
1. A light emitting diode element, comprising:
a light emitting diode; and
a glass covering sealing the light emitting diode;
wherein
the glass covering is directly bonded to at least one surface of the light emitting diode element,
the glass of the covering consists essentially of, as represented by mol% based on the following oxides:

from 45 to 70% of SnO,
from 15 to 40% of $P_2O_5$,
from 0.1 to 13% of ZnO,
from 0 to 10% of $SiO_2+GeO_2$,
from 0 to 30% of $Li_2O+Na_2O+K_2O$, and
from 0 to 20% of MgO+CaO+SrO+BaO, and
a total amount of SnO and ZnO is from 1.8 to 2.2 times an amount of $P_2O_5$.

2. The light emitting diode element according to claim 1, wherein a refractive index of the glass of the covering is at least 1.6 at a wavelength of 400nm.

3. The light emitting diode element according to claim 1, wherein a refractive index of the glass of the covering is at least 1.7 at a wavelength of 633nm.

4. The light emitting diode element according to claim 1, wherein an average linear expansion coefficient of the glass of the covering is from $75\times10^{-7}$ to $140\times10^{-7}/°$ C. within a range of from 50 to 300° C.

5. The light emitting diode element according to claim 1, wherein a crystallization temperature of the glass of the covering is higher than 400° C.

6. The light emitting diode element according to claim 1, wherein a temperature at which a viscosity of the glass becomes $10^5$P is less than 500° C.

7. The light emitting diode element according to claim 1, wherein a crystallization temperature is at least 60° C. higher than a softening point of the glass.

8. The light emitting diode element according to claim 1, wherein the glass comprises ZnO in an amount of 3% to 13%.

9. The light emitting diode element according to claim 1, wherein the total amount of SnO and ZnO is from 1.9 to 2.1 times the amount of $P_2O_5$.

10. The light emitting diode element according to claim 1, wherein the glass of the covering has a light transmittance of at least 70% at a wavelength of from 400 to 750 nm.

11. The light emitting diode element according to claim 1, wherein the glass of the covering has a light transmittance of at least 70% at a wavelength of from 360 to 750 nm.

12. The light emitting diode element according to claim 1, wherein a crystallization temperature is at least 90° C. higher than a softening point of the glass.

13. The light emitting diode element according to claim 1, wherein a refractive index of the glass of the covering is at least 2.0 at a wavelength of 400 nm.

14. The light emitting diode element according to claim 1, wherein a temperature at which a viscosity of the glass becomes $10^5$P is at most 380° C.

* * * * *